(12) United States Patent
Thomas et al.

(10) Patent No.: US 8,423,305 B2
(45) Date of Patent: Apr. 16, 2013

(54) WIRE SYSTEM ASSESSMENT

(75) Inventors: Terrance L. Thomas, Covington, WA (US); Camron Ravell Call, Marysville, WA (US); Monica C. Rosman LaFever, Renton, WA (US); Carey Chaplin, Seattle, WA (US)

(73) Assignee: The Boeing Company, Chicago, IL (US)

( * ) Notice: Subject to any disclaimer, the term of this patent is extended or adjusted under 35 U.S.C. 154(b) by 539 days.

(21) Appl. No.: 12/645,805

(22) Filed: Dec. 23, 2009

(65) Prior Publication Data

US 2011/0153235 A1    Jun. 23, 2011

(51) Int. Cl.
*G06F 19/00* (2011.01)

(52) U.S. Cl.
USPC ............................. 702/59; 702/183; 345/440

(58) Field of Classification Search ............. 702/58, 702/59, 79, 117, 118, 124; 324/512, 534, 324/503, 525, 527, 528, 533, 555
See application file for complete search history.

(56) References Cited

U.S. PATENT DOCUMENTS

| | | | |
|---|---|---|---|
| 4,970,664 A | 11/1990 | Kaiser et al. | |
| 5,977,773 A | 11/1999 | Medelius et al. | |
| 6,272,387 B1 | 8/2001 | Yoon | |
| 6,606,731 B1 | 8/2003 | Baum et al. | |
| 6,766,331 B2 | 7/2004 | Shema et al. | |
| 6,922,432 B2 | 7/2005 | Callaway et al. | |
| 7,069,163 B2 | 6/2006 | Gunther et al. | |
| 7,139,668 B2 | 11/2006 | Bechhoefer | |
| 7,200,271 B2 | 4/2007 | Boose et al. | |
| 7,212,936 B2 | 5/2007 | Baum et al | |
| 7,250,772 B2 | 7/2007 | Furse et al. | |
| 7,282,922 B2 | 10/2007 | Lo et al. | |
| 7,295,119 B2 | 11/2007 | Rappaport et al. | |
| 7,353,130 B2 | 4/2008 | Booth, Jr. et al. | |
| 7,368,919 B2 | 5/2008 | Gervais | |
| 7,478,352 B2 | 1/2009 | Chaplin et al. | |
| 7,529,648 B2 | 5/2009 | Baum et al. | |
| 7,548,071 B2 | 6/2009 | Harrison et al. | |
| 7,558,212 B2 | 7/2009 | Olinski | |
| 7,636,622 B2 | 12/2009 | Underdal et al. | |
| 7,868,621 B2 | 1/2011 | Liu et al. | |
| 2002/0147561 A1 | 10/2002 | Baracat et al. | |
| 2004/0039976 A1 | 2/2004 | Gunther et al. | |

(Continued)

FOREIGN PATENT DOCUMENTS

FR    2822130 A1    9/2002

OTHER PUBLICATIONS

Pellon et al., "Aircraft Electrical System Monitoring with Arc Fault Circuit Protection and Automatic Fault Location", Sensata Technologies, 06-PSC18, 2006, pp. 1-6.

(Continued)

*Primary Examiner* — Manuel L Barbee
(74) *Attorney, Agent, or Firm* — Yee & Associates, P.C.

(57) ABSTRACT

The advantageous embodiments provide a method, a computer program product, and an apparatus for monitoring a wiring system. A number of responses to signals transmitted in a portion of the wiring system are measured to form a measured signature. Design data for the portion of the wiring system is retrieved. A number of expected responses for the signals in the portion of the wiring system are identified using the design data to form a computed signature. The measured signature is compared with the computed signature.

12 Claims, 8 Drawing Sheets

U.S. PATENT DOCUMENTS

| | | | |
|---|---|---|---|
| 2004/0230387 A1* | 11/2004 | Bechhoefer | 702/58 |
| 2005/0114096 A1 | 5/2005 | Baum et al. | |
| 2006/0012376 A1* | 1/2006 | Furse et al. | 324/534 |
| 2006/0043976 A1 | 3/2006 | Gervais | |
| 2006/0182269 A1 | 8/2006 | Lo et al. | |
| 2007/0236504 A1 | 10/2007 | Baum et al. | |
| 2007/0300198 A1 | 12/2007 | Chaplin et al. | |
| 2009/0228223 A1 | 9/2009 | Liu et al. | |
| 2010/0063754 A1 | 3/2010 | Thomas et al. | |

OTHER PUBLICATIONS

Smith et al., "Analysis of Spread Spectrum Time Domain Reflectometry for Wire Fault Location", IEEE Sensors Journal, vol. 5, No. 6, Dec. 2005, pp. 1469-1478.

Furse et al., "Spread Spectrum Sensors for Critical Fault Location on Live Wire Networks", Structural Control and Health Monitoring, www.interscience.wiley.com, Jun. 6, 2005, pp. 257-267.

Slenski et al., "Novel Technologies for Improving Wire System Integrity", Air Force Research Laboratory, Materials and Manufacturing Directorate, USA, 2006, pp. 1-19.

Thomas et al., "Boeing Commercial Airplanes Wire Assessment Activities", Aging Aircraft Conference, May 5-7, 2009, Kansas City, Missouri, pp. 1-18.

Bogatin, "Simulating a TDR", Printed Circuit Design & Manufacture, Jun. 2005, p. 48.

Lo et al., "Modeling and Simulation of Branched Wiring Networks", ACES Journal, vol. 23, No. 2, Jun. 2008, pp. 143-148.

USPTO Office Action for U.S. Appl. No. 12/208,638 dated Dec. 16, 2010.

USPTO Final Office Action dated May 26, 2011 for U.S. Appl. No. 12/208,638.

USPTO Office Action dated Sep. 29, 2011 for U.S. Appl. No. 12/208,638.

U.S. Appl. No. 12/208,638, filed Sep. 11, 2008, Thomas et al.

USPTO Final Office Action dated Mar. 15, 2012 for U.S. Appl. No. 12/208,638, 28 pages.

* cited by examiner

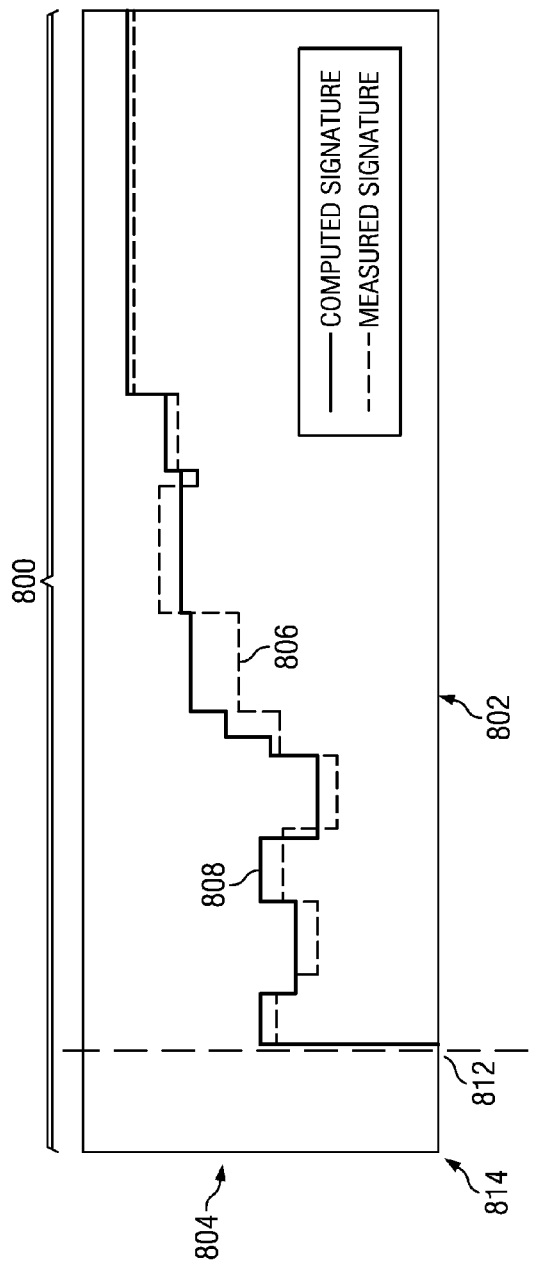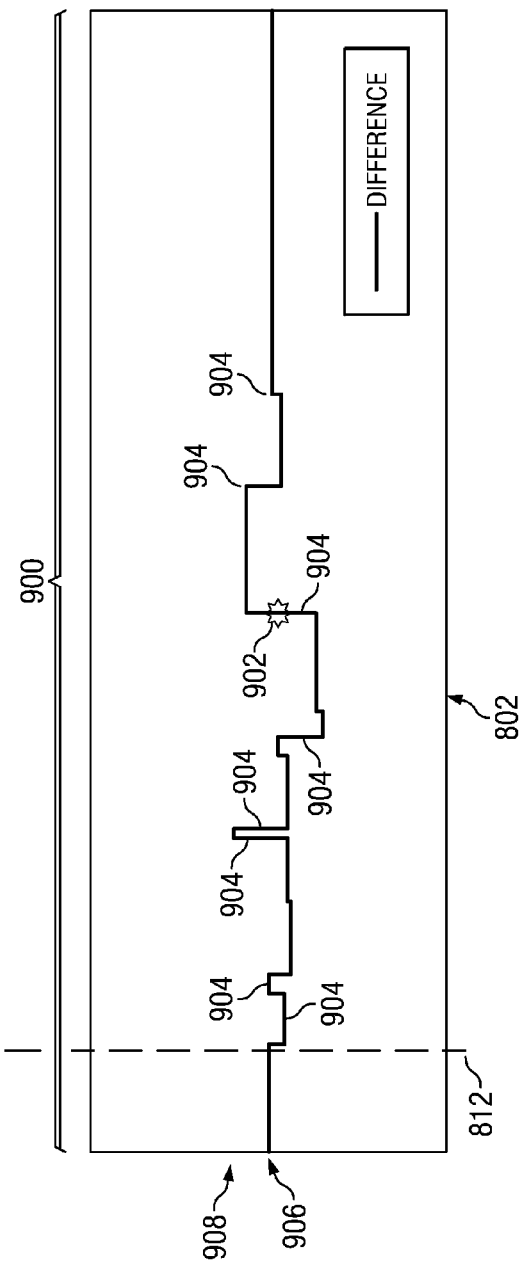

WIRE SYSTEM ASSESSMENT

BACKGROUND INFORMATION

1. Field:

The present disclosure relates generally to wiring systems in vehicles and in particular to a method and apparatus for testing a wiring system. Still more particularly, the present disclosure relates to a computer implemented method, apparatus, and computer usable program code for testing a wiring system.

2. Background:

Complex systems, such as modern aircraft, may have tens of miles of wiring. Wires are used to distribute power and/or data to various types of devices in an aircraft. The connections between devices, providing flow for power and/or data, are referred to as paths. A path may include any component that connects to a device. These systems of connections and devices may be referred to as wiring systems.

Wiring systems may operate with degraded performance due to inconsistencies in one or more connections and/or devices. Such inconsistencies may cause a loss of power or communication in various portions of the wiring system. For example, intermittent connection problems may result from inconsistencies in the wiring system. Inconsistencies are commonly reworked in order to resume normal operation of the wiring system. For example, a connector between multiple wires may stop operating normally when one or more wires in the connector become loose.

The connector and/or wire may need to be reworked or replaced to resume normal operation of the connector. In some cases, the connector and/or wire requires large amounts of time and energy for the technician to expose the connector and/or wire to the hands and/or tools of the technician. For example, a technician removes one or more panel covers to reach a connector. The technician may then reconnect the wire to the connector so the wires in each portion of the connector meet as designed. Finally, the technician replaces the panel covers to cover the connector.

A technician locates an inconsistency in a wiring system before reworking the inconsistency. One reason the technician locates the inconsistency is to determine what portion or portions of the wiring system must be reworked or replaced to restore normal operation of the wiring system. Due to the complexity of wiring systems in use today, locating inconsistencies can be cumbersome and/or time consuming.

A technician locates one or more inconsistencies by performing tests to locate one or more areas of the wiring system that are not performing normally. In some cases, tests are inconclusive or only accurate to a certain degree of specificity. For example, testing the wiring system may indicate to a technician that an inconsistency in a wiring system is located between two points in a wire that has numerous connectors.

The technician then makes an assumption for the location of the inconsistency from the known information and expends time and energy reaching and reworking and/or replacing the portions of the wiring system. In some cases, the assumption was incorrect and the wiring system remains in a degraded state of operation. In other cases, the technician spends more resources on replacing and/or reworking the portion of the wiring system than necessary. The technician may have spent more time, money, and energy to return the wiring system to normal operation than the technician would have spent if the location of the one or more inconsistencies in the wiring system were located more precisely.

Accordingly, it would be advantageous to have a method and apparatus, which takes into account one or more of the issues discussed above as well as possibly other issues.

SUMMARY

The advantageous embodiments provide a method, a computer program product, and an apparatus for monitoring a wiring system. A number of responses to signals transmitted in a portion of the wiring system are measured to form a measured signature. Design data for the portion of the wiring system is retrieved. A number of expected responses for the signals in the portion of the wiring system are identified using the design data to form a computed signature. The measured signature is compared with the computed signature.

In another advantageous embodiment, an apparatus comprises a bus, a memory connected to the bus, and a processor unit connected to the bus. The processor unit is configured to measure a number of responses to signals transmitted in a portion of the wiring system to form a measured signature, retrieve design data for the portion of the wiring system, identify a number of expected responses for the signals in the portion of the wiring system using the design data to form a computed signature, and compare the measured signature with the computed signature.

In yet another advantageous embodiment, a computer program product contains program code on a computer recordable storage medium. Program code is present for measuring a number of responses to signals transmitted in a portion of the wiring system to form a measured signature. Program code is present for retrieving design data for the portion of the wiring system. Program code is present for identifying a number of expected responses for the signals in the portion of the wiring system using the design data to form a computed signature. Program code is present for comparing the measured signature with the computed signature.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

FIG. 8 depicts an illustration of a graph of a computed signature and a measured signature in accordance with an advantageous embodiment;

FIG. 9 depicts an illustration of a difference graph in accordance with an advantageous embodiment;

DETAILED DESCRIPTION

Figure 1:
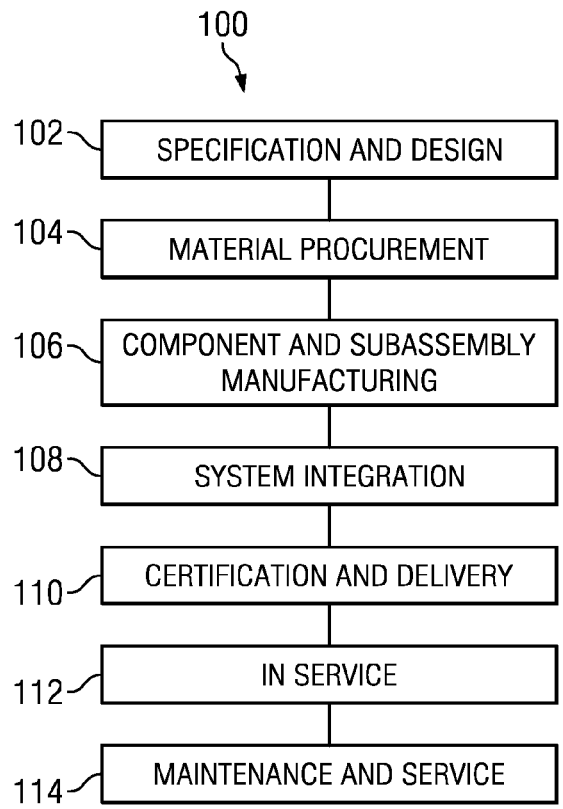
FIG. 1 depicts a diagram illustrating an aircraft manufacturing and service method in accordance with an advantageous embodiment.
Figure 2:
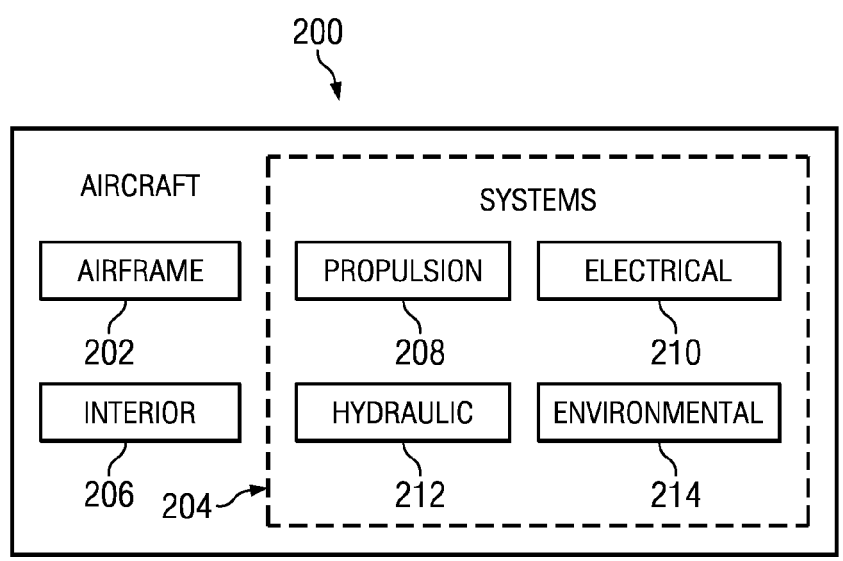
FIG. 2 depicts an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, and environmental system 214. Any number of other systems may be included. Although an aerospace example is shown, different advantageous embodiments may be applied to other industries, such as the transportation or automotive industry.

Apparatus and methods embodied herein may be employed during at least one of the stages of aircraft manufacturing and service method 100 in FIG. 1. For example, the apparatus and methods embodied herein may be used to test for inconsistencies in a wiring system of an aircraft 200. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items means, one or more items. For example, a number of apparatus embodiments are one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

Figure 3:
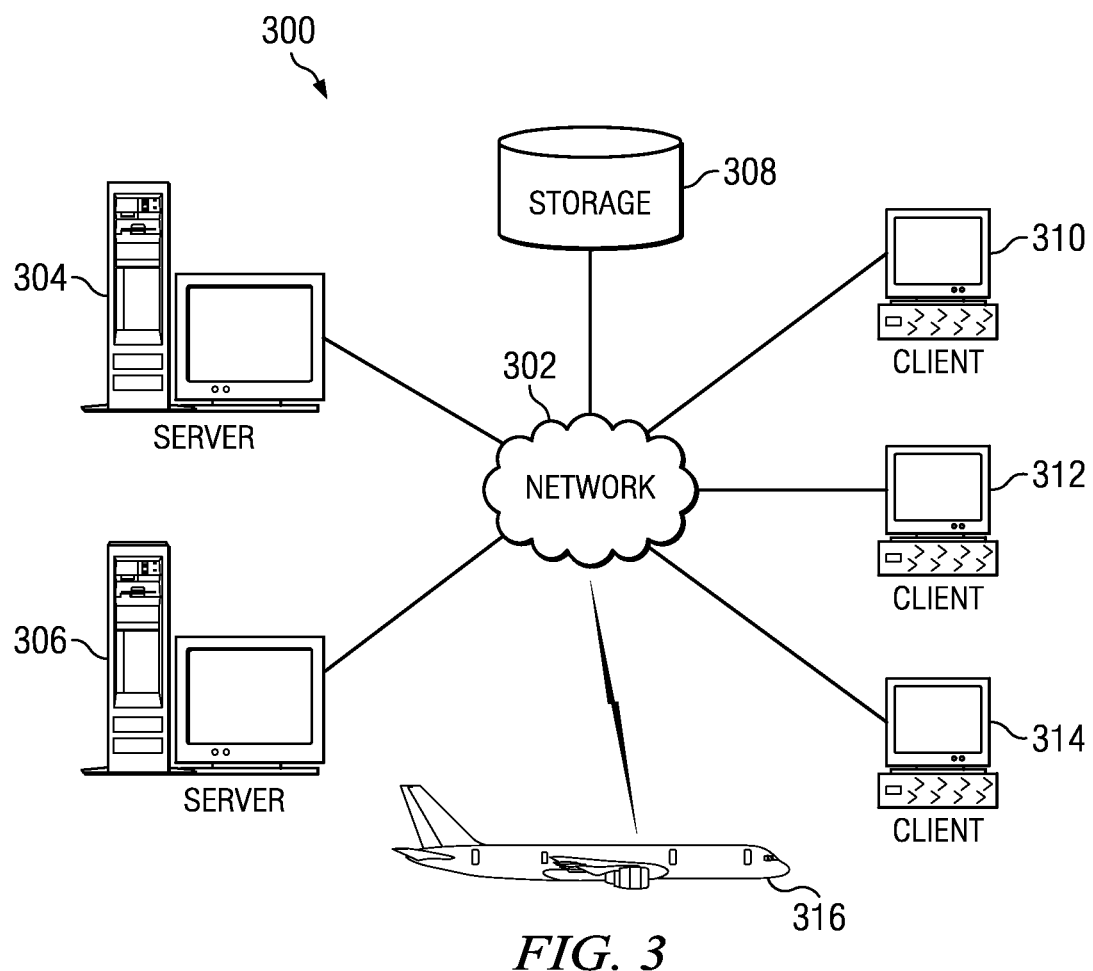
FIG. 3 depicts an illustration of a network of data processing systems in which the advantageous embodiments may be implemented.
Figure 4:
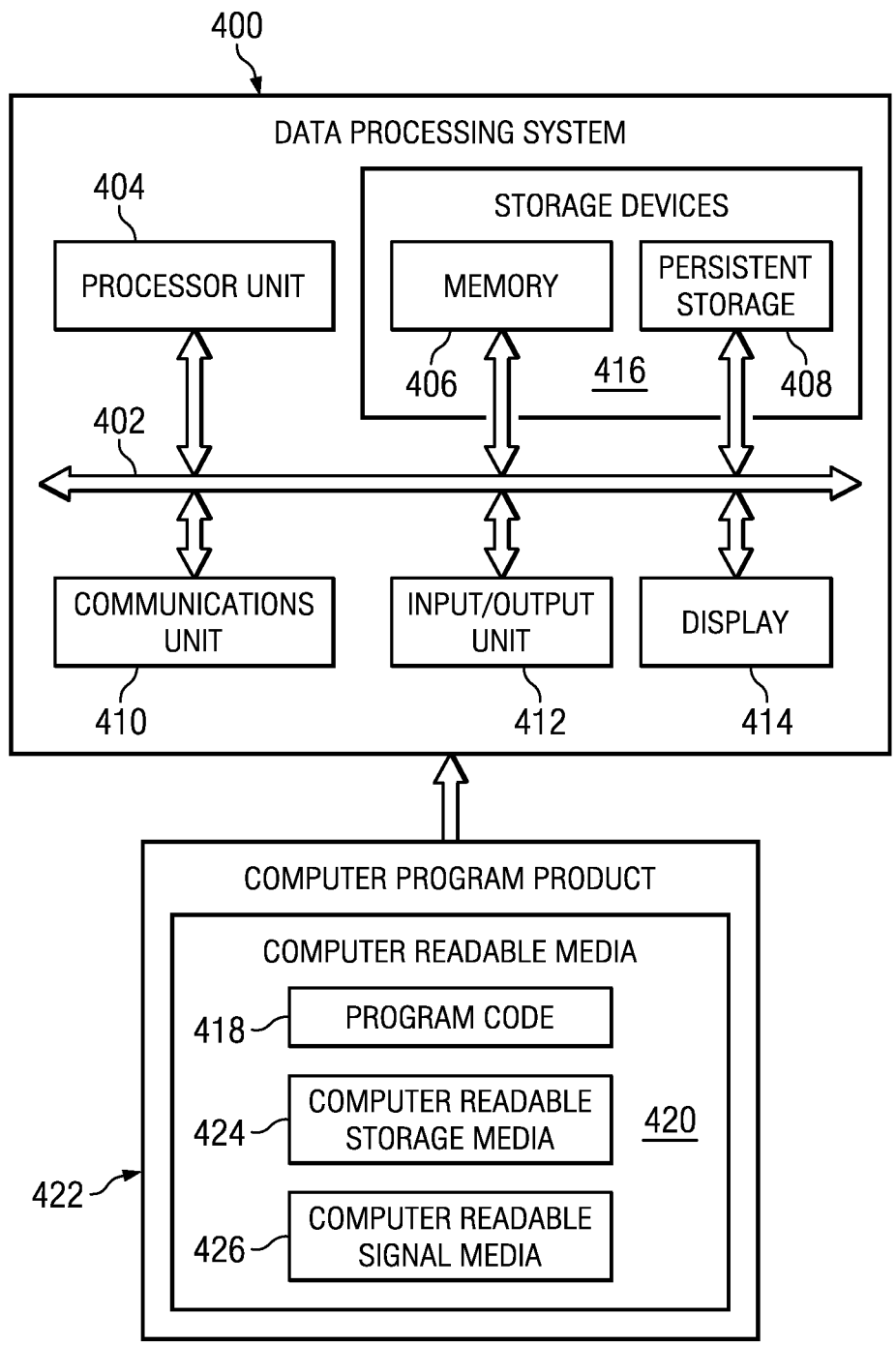
FIG. 4 depicts an illustration of a data processing system in which the advantageous embodiments may be implemented.

With reference now to FIGS. 3-4, exemplary diagrams of data processing environments are provided in which the advantageous embodiments of the present invention may be implemented. It should be appreciated that FIGS. 3-4 are only exemplary and are not intended to assert or imply any limitation with regard to the environments in which different embodiments may be implemented. Many modifications to the depicted environments may be made.

With reference now to the figures, FIG. 3 depicts a pictorial representation of a network of data processing systems in which the advantageous embodiments of the present invention may be implemented. Network data processing system 300 is a network of computers in which embodiments may be implemented. Network data processing system 300 may be used to test for inconsistencies in a wiring system of an aircraft, such as aircraft 200. Testing may be performed in any suitable aircraft manufacturing and service method, such as aircraft manufacturing and service method 100. For example, testing for inconsistencies in a wiring system of an aircraft may be performed during component and subassembly manufacturing 106, in service 112, and/or maintenance and service 114. Network data processing system 300 contains network 302, which is the medium used to provide communications links between various devices and computers connected together within network data processing system 300. Network 302 may include connections, such as wire, wireless communication links, or fiber optic cables.

In the depicted example, server 304 and server 306 connect to network 302 along with storage unit 308. In addition, clients 310, 312, and 314 connect to network 302. These clients 310, 312, and 314 may be, for example, personal computers or network computers. In the depicted example, server 304 provides data, such as boot files, operating system images, and applications to clients 310, 312, and 314. Clients 310, 312, and 314 are clients to server 304 in this example.

Aircraft 316 also is a client that may exchange information with clients 310, 312, and 314. Aircraft 316 also may exchange information with servers 304 and 306. Aircraft 316 may exchange data with different computers through a wireless communications link while in-flight or any other type of communications link while on the ground. In these examples, server 304, server 306, client 310, client 312, and client 314 may be computers. Network data processing system 300 may include additional servers, clients, and other devices not shown.

In one advantageous embodiment, client 310 is used as a test unit to transmit and measure reflected signals through a wiring system in aircraft 316. Server 306 may then be used as a simulation unit to simulate a computed signature that represents reflected signals of the tested wiring system when functioning properly. Of course, it will be appreciated that aircraft 316, client 310 and/or server 306 may contain parts or the entirety of either the test unit, the simulation unit, or both.

Aircraft 316 may also test a wiring system located onboard aircraft 316. Aircraft 316 may transmit a measured signature generated from reflected signals to client 310 and/or server 306, for example. Client 310 and/or server 306 may be located at a facility of the manufacturer of aircraft 316, an airline, or any other suitable location. Additionally, client 310 and/or server 306 may transmit and receive one or more requests and responses to aircraft 316 using network 302. The requests may be requests to control the testing of wiring systems onboard aircraft 316. The responses may be one or more measurements of reflected signals in the wiring system and/or alerts regarding the status of the wiring system.

In the depicted example, network data processing system 300 is the Internet with network 302 representing a worldwide collection of networks and gateways that use the Transmission Control Protocol/Internet Protocol (TCP/IP) suite of protocols to communicate with one another. Of course, network data processing system 300 also may be implemented as a number of different types of networks, such as for example, an intranet, a local area network (LAN), or a wide area network (WAN). FIG. 3 is intended as an example, and not as an architectural limitation for different embodiments.

Turning now to FIG. 4, a block diagram of a data processing system is depicted in accordance with an advantageous embodiment. Data processing system 400 is an example of a data processing system that may be used to implement servers and clients, such as server 304 and client 310. Further, data processing system 400 is an example of a data processing system that may be found in aircraft 316 in FIG. 3.

In this illustrative example, data processing system 400 includes communications fabric 402, which provides communications between processor unit 404, memory 406, persistent storage 408, communications unit 410, input/output (I/O) unit 412, and display 414.

Processor unit 404 serves to execute instructions for software that may be loaded into memory 406. Processor unit 404 may be a number of one or more processors or may be a multi-processor core, depending on the particular implementation. Further, processor unit 404 may be implemented using one or more heterogeneous processor systems, in which a main processor is present with secondary processors on a single chip. As another illustrative example, processor unit 404 may be a symmetric multi-processor system containing multiple processors of the same type.

Memory 406 and persistent storage 408 are examples of storage devices 416. A storage device is any piece of hardware that is capable of storing information, such as, for example, without limitation, data, program code in functional form, and/or other suitable information either on a temporary basis and/or a permanent basis. Memory 406, in these examples, may be, for example, a random access memory, or any other suitable volatile or non-volatile storage device. Persistent storage 408 may take various forms, depending on the particular implementation. For example, persistent storage 408 may contain one or more components or devices. For example, persistent storage 408 may be a hard drive, a flash memory, a rewritable optical disk, a rewritable magnetic tape, or some combination of the above. The media used by persistent storage 408 may be removable. For example, a removable hard drive may be used for persistent storage 408.

Communications unit 410, in these examples, provides for communication with other data processing systems or devices. In these examples, communications unit 410 is a network interface card. Communications unit 410 may provide communications through the use of either or both physical and wireless communications links.

Input/output unit 412 allows for the input and output of data with other devices that may be connected to data processing system 400. For example, input/output unit 412 may provide a connection for user input through a keyboard, a mouse, and/or some other suitable input device. Further, input/output unit 412 may send output to a printer. Display 414 provides a mechanism to display information to a user.

Instructions for the operating system, applications, and/or programs may be located in storage devices 416, which are in communication with processor unit 404 through communications fabric 402. In these illustrative examples, the instructions are in a functional form on persistent storage 408. These instructions may be loaded into memory 406 for execution by processor unit 404. The processes of the different embodiments may be performed by processor unit 404 using computer implemented instructions, which may be located in a memory, such as memory 406.

These instructions are referred to as program code, computer usable program code, or computer readable program code that may be read and executed by a processor in processor unit 404. The program code, in the different embodiments, may be embodied on different physical or computer readable storage media, such as memory 406 or persistent storage 408.

Program code 418 is located in a functional form on computer readable media 420 that is selectively removable and may be loaded onto or transferred to data processing system 400 for execution by processor unit 404. Program code 418 and computer readable media 420 form computer program product 422. In one example, computer readable media 420 may be computer readable storage media 424 or computer readable signal media 426. Computer readable storage media 424 may include, for example, an optical or magnetic disc that is inserted or placed into a drive or other device that is part of persistent storage 408 for transfer onto a storage device, such as a hard drive, that is part of persistent storage 408. Computer readable storage media 424 also may take the form of a persistent storage, such as a hard drive, a thumb drive, or a flash memory that is connected to data processing system 400. In some instances, computer readable storage media 424 may not be removable from data processing system 400.

Alternatively, program code 418 may be transferred to data processing system 400 using computer readable signal media 426. Computer readable signal media 426 may be, for example, a propagated data signal containing program code 418. For example, computer readable signal media 426 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative embodiments, program code 418 may be downloaded over a network to persistent storage 408 from another device or data processing system through computer readable signal media 426 for use within data processing system 400. For instance, program code stored in a computer readable storage media in a server data processing system may be downloaded over a network from the server to data processing system 400. The data processing system providing program code 418 may be a server computer, a client computer, or some other device capable of storing and transmitting program code 418.

The different components illustrated for data processing system 400 are not meant to provide architectural limitations to the manner in which different embodiments may be implemented. The different illustrative embodiments may be implemented in a data processing system including components in addition to or in place of those illustrated for data processing system 400. Other components shown in FIG. 4 can be varied from the illustrative examples shown. The different embodiments may be implemented using any hardware device or system capable of executing program code. As one example, data processing system 400 may include organic components integrated with inorganic components and/or may be comprised entirely of organic components excluding a human being. For example, a storage device may be comprised of an organic semiconductor.

As another example, a storage device in data processing system 400 is any hardware apparatus that may store data. Memory 406, persistent storage 408, and computer readable media 420 are examples of storage devices in a tangible form.

In another example, a bus system may be used to implement communications fabric 402 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 406 or a cache such as found in an interface and memory controller hub that may be present in communications fabric 402.

The different advantageous embodiments recognize and take into account a number of different considerations. For example, the different advantageous embodiments recognize that locating inconsistencies in a wiring system can be cumbersome and difficult. Currently available methods do not take advantage of an inconsistency location test that can locate an inconsistency at the wire and/or connector level, such as reflectometry. Reflectometry is an example of non-destructive evaluation (NDE) of a wiring system because reflectometry is not harmful to the wiring system. Non-destructive evaluation is the evaluation of wiring system components for inconsistencies through nondestructive methods.

A reflectometry test is a test for locating inconsistencies in wiring systems in which signals are transmitted through a portion of a wiring system. The wiring system is then monitored for reflections of the transmitted signals. Variations in the reflections of the transmitted signals may indicate an inconsistency in the wiring system at an indicated distance along a portion of the wiring system. A portion of the wiring system may be comprised of one or more wires, connectors, wiring harnesses, and splices. A splice is a location in a wire in which two or more wires are joined without use of a connector.

The results of a reflectometry test on a wiring system are referred to as a reflection signature. A signature from a wiring system that is being tested for one or more inconsistencies is referred to as a measured signature. A signature from the wiring system that is known to be without inconsistencies is referred to as a baseline signature. A baseline signature that is simulated as part of a simulation is referred to as a computed signature. The wiring system may be a physical wiring system or a digital model of a wiring system.

The different advantageous embodiments also recognize that a measured signature may not be helpful in locating an inconsistency in the wiring system without the baseline signature or a computed signature of the same wiring system. In other words, the results of a reflectometry test on a wiring system being tested for inconsistencies may not be helpful in locating an inconsistency in the wiring system unless the result of a reflectometry test on the same wiring system in a state without inconsistencies is also known.

The different advantageous embodiments also recognize that generating a baseline signature of a physical wiring system by transmitting signals through the wiring system in a state known to be fully functional is time-consuming and difficult to perform. Additionally, the baseline signature of a physical wiring system is difficult to keep updated because the baseline signature changes each time changes, reworks, and/or upgrades are made to the wiring system.

The different advantageous embodiments also recognize that storing the baseline signature of every wiring system for comparison is impractical. Each wiring system has a unique baseline signature, even between different builds of the same wiring system. For example, the wiring system of two aircraft of the same model and design may have different baseline signatures for each portion of the wiring system. This difference in baseline signature may be due to differences in construction of the wiring systems or their platforms, such as an aircraft containing the wiring system.

For example, small differences in wire length, connector type, and the neighboring environment, such as distance between wires and the number of adjacent pins in a connector, can each affect the baseline signature of each wiring system. Additionally, other operations such as normal flight of an aircraft containing the wiring system may change the baseline signature due to wiring systems moving closer or farther from other wiring systems and/or parts of the platform, such as other parts of the airplane containing the wiring system.

Thus, the different advantageous embodiments provide a method, a computer program product, and an apparatus for monitoring a wiring system. A number of responses to signals transmitted in a portion of the wiring system are measured to form a measured signature. Design data for the portion of the wiring system is retrieved. A number of expected responses for the signals in the portion of the wiring system are identified using the design data to form a computed signature. The measured signature is compared with the computed signature.

Figure 5:
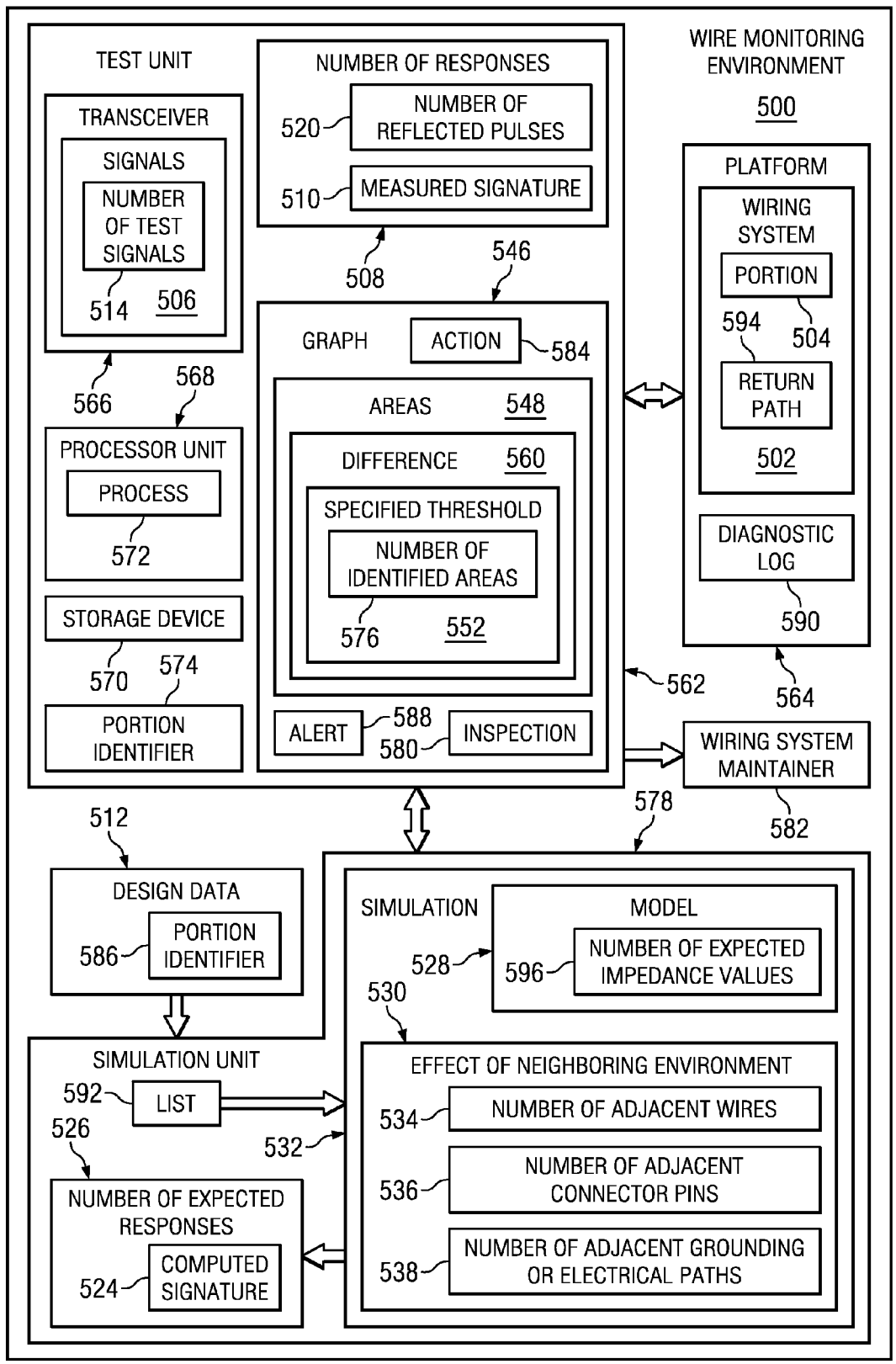
FIG. 5 depicts an illustration of a wire monitoring environment in accordance with an advantageous embodiment.

Turning now to FIG. 5, a wire monitoring environment is depicted in accordance with an advantageous embodiment. Wire monitoring environment 500 may be implemented in a network data processing system, such as network data processing system 400 in FIG. 4. The operations of wire monitoring environment 500 may be performed during any suitable aircraft manufacturing and service method, such as manufacturing and service method 100. Of course, wire monitoring environment 500 may perform operations during any suitable manufacturing and service method for other platforms as well. For example, wire monitoring environment 500 may also perform operations during a manufacturing and service method for a spacecraft, a vehicle, or a building.

Test unit 562 assesses, monitors, and/or communicates with wiring system 502. Wiring system 502 is located within platform 564. In this example, platform 564 is an aircraft. Test unit 562 may be built into platform 564, or in portable form such that test unit 562 may be moved around platform 564 to perform tests on wiring systems or portions of wiring systems located around platform 564.

Wiring system 502 comprises one or more of portion 504. Portion 504 may be a number of paths, a number of wires, a number of connectors, a number of wiring harnesses, a number of splices, a number of terminal lug connections, or any other suitable number of components and/or subcomponents of wiring system 502.

Test unit 562 may be a data processing system, such as data processing system 400 from FIG. 4. Test unit 562 may comprise a number of components, such as processor unit 568, transceiver 566, and storage device 570. Processor unit 568 may run process 572.

In this example, test unit 562 is used to locate one or more inconsistencies in portion 504 of wiring system 502. Process 572 may be a diagnostic process. Portion identifier 574 is set to an identifier for portion 504. In one advantageous embodiment, portion identifier 574 is entered by the user. However, in other advantageous embodiments, portion identifier 574 is read from a data source, such as a bar code or Radio Frequency IDentification (RFID) tag associated with portion 504. Portion identifier 574 uniquely identifies the combination of components that make up the portion 504 within platform 564.

For example, a particular type of connector in a particular location on a Boeing 747 aircraft with a particular component arrangement has the same portion identifier 574 as the same type of connector in the same location on another Boeing 747 aircraft with the same component layout. However, the same connector would have a different portion identifier 574 than a different connector of the same type on the same aircraft but in a different location. The same connector would also have a different portion identifier 574 than the same type of connector in the same location on the same type of aircraft but after the layout of the components in the wiring system has changed due to a revision of the wiring system.

Processor unit 568 running process 572 causes transceiver 566 to transmit signals 506 through portion 504. Signals 506 may be number of test signals 514. In one advantageous embodiment, number of test signals 514 is a number of time domain reflectometry test signals.

While number of test signals 514 is being transmitted through portion 504, test unit 562 monitors for number of responses 508. Number of responses 508 may be number of reflected pulses 520. In one advantageous embodiment, number of reflected pulses 520 represents an impedance inconsistency along portion 504. Number of reflected pulses 520 may be represented as measured signature 510. In one advantageous embodiment, measured signature 510 is a representation of variations in number of reflected pulses 520 as number of test signals 514 travel over portion 504.

Number of test signals 514 are reflected back to test unit 562 along portion 504 using return path 594. Return path 594 is the electrical path used by number of test signals 514 during transmission of test signals 506 and reflection back to test unit 562. Return path 594 is selected by wiring system maintainer 582 or test unit 562. Wiring system maintainer 582 may be located in a different location than test unit 562 in some advantageous embodiments. In one advantageous embodiment, return path 594 is selected by connecting test unit 562 to a component of wiring system 502 electrically coupled to portion 504. For example, return path 594 may be a wire or connector pin that is physically near portion 504. Alternatively, return path 594 may be an electrical ground for wiring system 502. In some advantageous embodiments, portion identifier 574 comprises both an identification of portion 504 and an identification of return path 594. In other advantageous embodiments, return path 594 may be a pin in the same connector as portion 504, a pin in another connector, a harness shield, or an electrical ground.

Measured signature 510 represents number of reflected pulses 520 over time. In other words, as time elapses, number of test signals 514 travels further from test unit 562 through portion 504. Therefore, number of reflected pulses 520 received later in time represents fluctuations in number of test signals 514 encountered at a greater distance from test unit 562 along portion 504 than number of reflected pulses 520 received earlier in time.

In some advantageous embodiments, test unit 562 transmits portion identifier 574 to simulation unit 578. Test unit 562 may also transmit measured signature 510. In other advantageous embodiments, portion identifier 574 and measured signature 510 are stored in test unit 562 until a later period in time or until computed signature 524 is received from simulation unit 578.

Simulation unit 578 is a data processing system, such as data processing system 400 in FIG. 4. In some advantageous embodiments, simulation unit 578 is a client and/or server computer, such as server computer 306 and/or client computer 310 in FIG. 3. In other advantageous embodiments, however, simulation unit 578 is a process, such as process 572 running on processor unit 568 within test unit 562.

It will be appreciated that simulation unit 578 may be physically located in any suitable location. For example, simulation unit 578 may be located within platform 564, on a data processing system across a network, such as network 302 in FIG. 3, from test unit 562. For example, simulation unit 578 may be located in a maintenance shop, at a manufacturer for wiring system 502, or at a service provider.

Design data 512 is a digital representation of wiring system 502. Design data 512 may include, for example, properties, locations, and/or characteristics of wires, connectors, wiring harnesses, terminating lug connections, and/or splices. In one advantageous embodiment, design data 512 is a digital wiring schematic. For example, design data 512 may be stored in a format accessible to Electronic Schematics and Wiring Analyst Tool (ESWAT) from Boeing in Chicago, Ill. and/or Wiring Illuminator Web licensed by Boeing to Continental Data Graphics (CDG) external distribution. Design data 512 may also include additional properties of wiring system 502, such as the materials used to build wiring system 502. Design data 512 may be stored on a storage device within simulation unit 578 or in another storage device outside simulation unit 578. For example, design data 512 may be stored within network attached storage, such as storage unit 308 in FIG. 3.

Simulation unit 578 receives portion identifier 574 from test unit 562 and stores portion identifier 574 as portion identifier 586. Alternatively, portion identifier 586 is received from a user input. Portion identifier 586 uniquely identifies the design data 512 associated with portion 504 to load. For example, portion identifier 586 may be a number that identifies a connector or a portion of a connector. For example, the portion of the connector may be a contact or pin within the connector. Portion identifier 586 may also identify return path 594. For example, portion identifier 586 may contain a number that represents a first contact in a connector and a number that represents a second contact in the connector electrically coupled to the first contact.

Portion identifier 586 may be unique to a model or design for platform 564. A reference designator is an identifier for portion 504 that is unique to portion 504. For example, portion identifier 586 for a particular connector on a Boeing 747 aircraft has the same unique connector identifier as the connector in the same position on another Boeing 747 aircraft.

For example, portion identifier 574 entered on test unit 562 may represent a connector of a particular type in a particular location on a Boeing 747 aircraft with a particular build configuration that was tested by a technician using test unit 562. Simulation unit 578 receives portion identifier 574 from test unit 562 and stores portion identifier 574 as portion identifier 586.

Simulation unit 578 retrieves design data 512 associated with portion identifier 586. Simulation unit 578 may retrieve design data 512 for portion 504 by creating list 592. List 592 is a listing of the wires, connectors, splices, lug connections and/or other suitable components or subcomponents of portion 504 in design data 512 that would be encountered by number of test signals 514 while traveling through portion 504. In an advantageous embodiment, list 592 also contains the part numbers and/or identifiers of the items in list 592.

For example, assume portion identifier 586 designates a first pin in a connector and a return path of a second pin in the same connector. Simulation unit 578 locates the connector in design data 512 using portion identifier 586. Simulation unit 578 then creates list 592 by adding the sequence of components to list 592 that would be encountered by signals traveling between the first pin in the connector and the second pin in the connector.

Simulation unit 578 then performs simulation 532. Simulation 532 is a process that generates number of expected responses 526 for portion 504. Number of expected responses 526 is a simulated version of number of reflected pulses 520 in portion 504, with portion 504 having no inconsistencies. To generate number of expected responses 526, simulation unit 578 may use model 528 to generate number of expected impedance values 596.

Model 528 may be a mathematical model. In some advantageous embodiments, model 528 generates number of expected responses 526 by calculating reflection coefficients and representing the reflection coefficients as a series of impulse responses. Model 528 may then integrate the impulse responses to simulate a step time domain reflectometry signature. Model 528 uses radio frequency properties of the items in list 592 to generate number of expected impedance values 596 for portion 504. For example, radio frequency properties of the items in list 592 may include velocity of propagation, attenuation, the dielectric constant of an insulating material, inductance, capacitance, and other suitable properties. Other properties used by model 528 may include conductivity, lengths of wire, types of connectors, and wire material of the items in list 592.

Model 528 may generate number of expected impedance values 596 with a margin of error. In some advantageous embodiments, simulation unit 578 reduces the error in number of expected impedance values 596 using known properties of test unit 562 and/or portion 504. In other words, simulation 532 may modify number of expected impedance values 596 for particular distances based on characteristics of test unit 562 and/or portion 504.

For example, simulation unit 578 may also receive measured signature from test unit 562. Simulation unit 578 may modify values in number of expected impedance values 596 when a particular type of test unit 562 transmitted measured signature 510. In other words, simulation unit 578 may increase or decrease the magnitude of and/or distance between number of expected impedance values 596 when test unit 562 is known to simulation unit 578 to be calibrated more sensitive or less sensitive than a normal test unit.

In such advantageous embodiments, simulation unit 578 may instead modify measured signature 510 by increasing or decreasing the magnitude and/or distance between portions of measured signature 510. Simulation unit 578 may modify measured signature 510 when test unit 562 is known to simulation unit 578 to be incorrectly calibrated and/or the timing of test unit 562 is inaccurate. Modifying measured signature 510 or number of expected impedance values 596 may improve correlation between measured signature 510 and number of expected impedance values 596 versus unmodified values for measured signature 510 and number of expected impedance values 596.

In other advantageous embodiments, number of expected impedance values 596 are identified in a table, a database, or another suitable data source, based on the items in list 592.

In another advantageous embodiment, simulation 532 is a finite element analysis. A finite element analysis is a numerical technique for finding solutions of partial differential equations (PDE) as well as integral equations. The solutions may have a margin of error. A finite element analysis may be used to generate number of expected responses 526 by simulating the effects of portion 504 on number of test signals 514 when portion 504 is in a fully operational state.

Number of expected impedance values 596 comprises values of electrical resistance that may be encountered by number of test signals 514 traveling within portion 504. In one advantageous embodiment, number of expected impedance values 596 comprises one value for each item in list 592. Additionally, in some advantageous embodiments, number of expected impedance values 596 includes a value representing the impedance that would be encountered by number of test signals 514 while number of test signals 514 travel through test unit 562.

Simulation 532 then simulates the effect of neighboring environment 530 on number of expected impedance values 596. Effect of neighboring environment 530 may include, for example, changes to number of expected impedance values 596 due to the presence and physical spacing of a number of adjacent wires 534, number of adjacent connector pins 536, and number of adjacent grounding or electrical paths 538. In an advantageous embodiment, number of adjacent wires 534, number of adjacent connector pins 536, and/or number of adjacent grounding or electrical paths 538 cause electromagnetic interference in portion 504 when number of test signals 514 is transmitted through portion 504. For example, simulation 532 simulates the effect of interference on number of test signals 514 in a wire and connector from number of adjacent wires 534 and number of adjacent connector pins 536. Number of expected impedance values, as modified by effect of neighboring environment 530 form number of expected responses 526.

Simulation unit 578 then continues to perform simulation 532 to generate computed signature 524. Computed signature 524 represents number of expected responses 526 over a particular distance. The distance may be the distance traveled by number of test signals 514 between being transmitted by test unit 562 and number of reflected pulses 520 being received by test unit 562.

In advantageous embodiments in which test unit 562 does not transmit measured signature 510 to simulation unit 578, simulation unit 578 transmits graph 546 to test unit 562. Test unit 562 then presents graph 546. In advantageous embodiments in which test unit 562 transmits measured signature 510 to simulation unit 578, simulation unit 578 presents graph 546. It will be appreciated that in some advantageous embodiments, both test unit 562 and simulation unit 578 present graph 546. Graph 546 may be presented using a display device, such as display 214 in FIG. 2.

In an advantageous embodiment, graph 546 presents computed signature 524 and measured signature 510 each as a line or series of connected points on a coordinate plane. Graph 546 may be presented with a horizontal axis representing a distance from the point in portion 504 where number of test signals 514 were transmitted. The distance may be a function of the time between the transmission of number of test signals 514 and the observation of particular number of reflected pulses 520. Graph 546 may be presented with a vertical axis representing the quantity and/or signal strength of number of reflected pulses 520.

In some advantageous embodiments, measured signature 510 differs from computed signature 524. One or more differences 560 may be located within one or more areas 548 of graph 546. Differences 560 may be represented by a divergence of the lines representing measured signature 510 and computed signature 524. The presence of differences 560 may indicate the location of one or more inconsistencies in portion 504. Graph 546 may identify differences 560 using an identifier. The identifier may be shading, coloring, an icon, or any other suitable identifier.

Graph 546 may identify all differences 560 or only differences 560 that exceed specified threshold 552. Identified areas 576 are areas in which differences 560 exceed specified threshold 552. Specified threshold 552 may be set by the user or determined based on an estimated accuracy of computed signature 524. Specified threshold 552 prevents differences 560 that are within a margin of error in simulation 532 in generating computed signature 524.

When identified areas 576 are identified by graph 546, an action 584 may be initiated. Action 584 may be presenting alert 588. Alert 588 may request an inspection 580 of the identified areas 576 in portion 504. Inspection 580 may be a visual inspection performed by a user.

Action 584 may also be sending measured signature 510 to wiring system maintainer 582. Wiring system maintainer 582 may be a data processing system, like data processing system 400 from FIG. 4. Wiring system maintainer 582 may be a second test unit 562 and/or simulation unit 578. Wiring system maintainer 582 may be physically located at a facility of a wiring system manufacturer, maintenance firm, airline, airport, platform manufacturer, or any other suitable location.

Action 584 may also be storing measured signature 510 and/or computed signature 524 in diagnostic log 590. Diagnostic log 590 may be stored on a storage device, such as one or more storage devices 416 from FIG. 4. Diagnostic log 590 may contain wiring system maintenance data, including past and current measured signatures, baseline signatures, and past and current computed signatures.

The illustration of wire monitoring environment 500 in FIG. 5 is presented for purposes of illustrating different features of the advantageous embodiments and not meant to imply physical or architectural limitations to the manner in which different features may be implemented.

For example, in other advantageous embodiments, components of wire monitoring environment 500 are located at a number of different physical locations. For example, test unit 562 may be located within platform 564 or outside platform 564. Graph 546 may be displayed on a second test unit 562 located at a service provider, aircraft manufacturer, airline or another suitable location. Simulation unit 578 may be a process running within a data processing system, such as data processing system 400, at a service provider, within platform 564, in a maintenance facility, at a manufacturer facility or at any other suitable location. Simulation unit 578 may be located within a client computer or server computer, such as client computer 310 or server computer 306, respectively. Additionally, simulation unit 578 may be located within test unit 562.

In another advantageous embodiment, test unit 562 does not present difference 560, areas 548, specified threshold 552, and/or number of identified areas 576. In such an advantageous embodiment, test unit 562 presents graph 546 representing measured signature 510, and a second graph 546 representing computed signature 524. Test unit 562 does not present difference 560 on graph 546 in this advantageous embodiment.

In yet other advantageous embodiments, graph 546 is not presented. Instead, measured signature 510 and/or computed signature 524 are presented in text form. For example, measured signature 510 and computed signature 524 may be described using a number of numeric values. The number of numeric values presented may represent the difference between measured signature 510 and computed signature 524 at a particular number of distances in measured signature 510. The number of numeric values presented may also represent a particular number of differences in order of magnitude.

Platform 564 is depicted as an aircraft in these examples. In yet other advantageous embodiment, platform 564 may be, for example, without limitation, a mobile platform, a stationary platform, a land-based structure, an aquatic-based structure, a space-based structure, an aircraft, a surface ship, a tank, a personnel carrier, train, a spacecraft, a space station, a satellite, a submarine, an automobile, a power plant, bridge, a dam, a manufacturing facility, a building, and other suitable platform with a wiring system.

Figure 6:
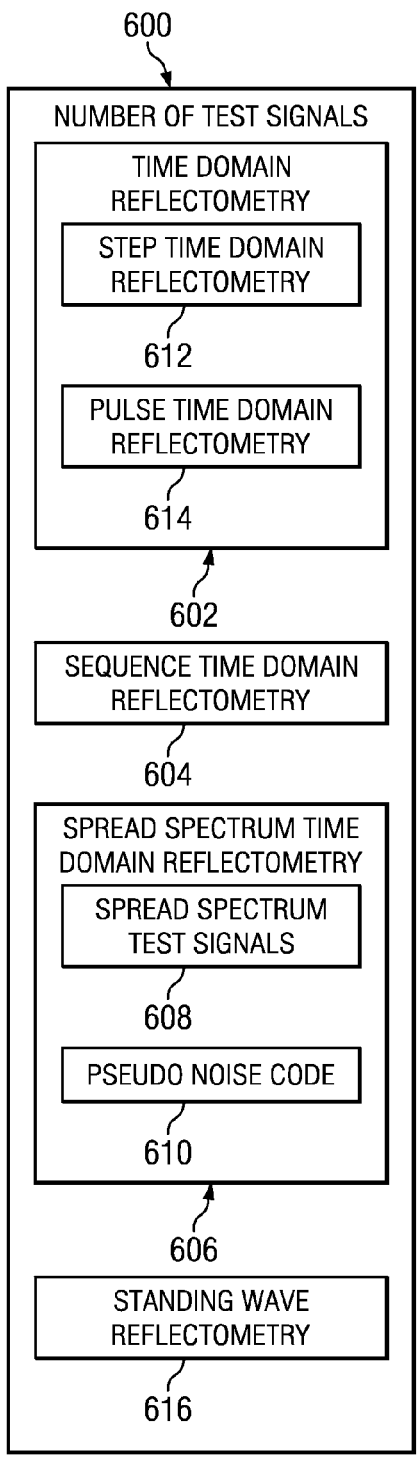
FIG. 6 depicts an illustration of a number of test signals in accordance with an advantageous embodiment.

Turning now to FIG. 6, a number of test signals is depicted in accordance with an advantageous embodiment. Number of test signals 600 may be a number of test signals like number of test signals 514 in FIG. 5.

Number of test signals 600 may comprise one or more types of test signals that use one or more testing methods. In one advantageous embodiment, number of test signals 600 uses time domain reflectometry 602. Time domain reflectometry 602 measures the signals reflected back to the point in a portion of a wiring system where test signals were transmitted. The reflected signals are recorded over time. The time elapsed may indicate the distance from the test location to the point in the portion of the wiring system that reflected the test signals.

In one advantageous embodiment, time domain reflectometry 602 is step time domain reflectometry 612. In step time domain reflectometry 612, each signal in number of test signals 600 is transmitted with a particular time period for voltage to rise or fall to the level of the signal. In another advantageous embodiment, time domain reflectometry 602 is pulse time domain reflectometry 614. In pulse time domain reflectometry 614, each signal in number of test signals 600 is transmitted with the same duration.

Number of test signals 600 may also use another testing method, such as sequence time domain reflectometry 604. Sequence time domain reflectometry 604 uses a lower amplitude number of test signals 600 and a higher sensitivity than the amplitude and sensitivity used in time domain reflectometry 602.

Number of test signals 600 may also use another test method, such as spread spectrum time domain reflectometry 606. In an advantageous embodiment, number of test signals 600 is a number of spread spectrum test signals 608. In an advantageous embodiment in which number of test signals 600 use time domain reflectometry 602, spread spectrum test signals 608 modulate number of test signals 600 with repeating pseudo noise (PN) code 610 in the portion of the wiring system. Because spread spectrum test signals 608 have a pseudo noise code 610, spread spectrum test signals 608 may be distinguished from other data being transmitted through the portion of the wiring system. Therefore, spread spectrum test signals 608 may be transmitted and monitored during energized operation of the portion of the wiring system.

For example, spread spectrum test signals 608 may be transmitted and received in an aircraft wiring system while the aircraft is in operation and/or in flight. This allows monitored signatures to be generated and wire monitoring to take place while the airplane is in flight and/or in operation. In one advantageous embodiment, a test unit, such as test unit 562, and/or a simulation unit, such as simulation unit 578 are integrated within the wiring system of a platform, such as platform 564.

The test unit transmits spread spectrum test signals 608 periodically. The test unit may then transmit one or more reports if one or more conditions are satisfied. For example, the test unit may transmit a report to a user or aircraft manufacturer when a difference between a measured signature 510 and a previously generated baseline signature is greater than a specified threshold.

In yet another advantageous embodiment, number of test signals uses standing wave reflectometry 616. Standing wave reflectometry 616 creates standing waves against inconsistencies in a wiring system, such as wiring system 502, by transmitting number of test signals 600 at a number of different frequencies through the portion. The reflected magnitude of the standing wave is received and stored. Of course, number of test signals 600 may use any suitable reflectometry system.

Figure 7:
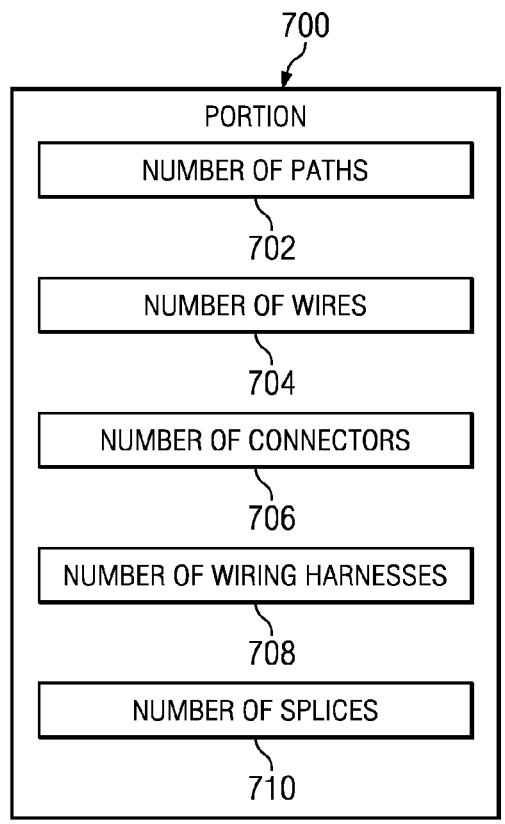
FIG. 7 depicts an illustration of a portion of a wiring system in accordance with an advantageous embodiment.

Turning now to FIG. 7, a portion of a wiring system is depicted in accordance with an advantageous embodiment. Portion 700 is a portion of a wiring system, such as portion 504 in FIG. 5. Portion 700 is comprised of any combination of number of paths 702, number of wires 704, number of connectors 706, number of wiring harnesses 708, and number of splices 710. Of course, it will be appreciated that the aforementioned portions are only examples and that portion 700 may also be any other suitable portion or combination of suitable portions of a wiring system.

A number, as used herein, means one or more of an item. For example, a number of wires means one or more wires. Likewise, a set, as used herein, means one or more of an item. For example, a number of test signals means one or more test signals.

Number of paths 702 contains the medium through which power and data may flow to other components of wiring system, such as wiring system 502 in FIG. 5. Number of paths 702 may include, for example, electrical wires, optical cables, network cables, or other types of paths capable of conducting or routing power and/or data. A wire in number of wires 704 is a string of metal that is capable of conducting electricity and/or data.

A connector in number of connectors 706 is a junction of two or more wires such that electricity and/or light and/or data may travel from one wire to the other wire(s). For example, at least one connector in number of connectors 706 may be a DB9 connector. Some connectors in number of connectors 706 comprise a male and a female portion. The male portion may have one or more conductive pins that are inserted into recesses in the female portion of the connector. Once the male and female portions of the connector are connected, the connector provides conductivity between each side of the one or more wires joined by the connector.

A wiring harness in number of wiring harnesses 708 is a number of wires that are temporarily or permanently bound together. For example, a wiring harness may comprise a number of wires that are joined at least a portion of the length of the number of wires with an external harness sleeve, conductive shield, or heat shrink tubing.

A splice in number of splices 710 is a particular type of join between two or more wires. A splice joins the end of a first wire with a portion of a second wire that is not the end of the second wire. For example, a splice may be a connection between two wires, where the end of the first wire is joined to the middle of the second wire.

With specificity to FIGS. 8 and 9, an example graph of a computed signature and a measured signature and an example graph of the difference between the example computed signature and the example measured signature are depicted in accordance with an advantageous embodiment.

Turning now to FIG. 8, a graph of a computed signature and a measured signature is depicted in accordance with an advantageous embodiment. Graph 800 is an example of graph 546 from FIG. 5. Graph 800 may be presented by a test unit, such as test unit 562, a simulation unit, such as simulation unit 578, or both. Graph 800 may be presented using a display, such as display 414 from FIG. 4.

Graph 800 has a horizontal axis and a vertical axis. In this example, the horizontal access is a distance axis 802. Distance axis 802 represents the distance away from the location in a portion of a wiring system from which test signals were sent. Points on graph 800 closer to the intersection point between distance axis 802 and reflected signal axis 804 represent a shorter distance from the physical location at which the test signals were transmitted. Likewise, points on graph 800 farther from the intersection point between distance axis 802 and the vertical axis represent a longer distance from the physical location at which the test signals were transmitted.

The vertical axis is reflected signal axis 804. Reflected signal axis 804 represents the strength of the reflected test signals at the point from which the test signals were transmitted. The strength of the reflected test signals may correspond to an impedance encountered by the test signals at a given location in the tested portion of the wiring system. Points on graph 800 closer to the intersection between reflected signal axis 804 and distance axis 802 indicate a lower strength, while points on graph 800 farther from the intersection between reflected signal axis 804 and distance axis 802 indicate a greater strength.

Point 814 is a point along reflected signal axis 804 that indicates that the strength of the reflected test signals is negative 1 for a particular point on distance axis 802. Line 812 is presented at the location along distance axis 802 representing the test interface point. The test interface point represents the location of a test unit 562, at which test signals enter the tested portion of the wiring system. The test interface point may represent the distance between test unit and the wiring system. In one advantageous embodiments, line 812 is presented at the distance that represents the length of test leads attached to the test tool.

Graph 800 is presented with measured signature 806 and computed signature 808. Measured signature 806 may be measured signature 510 from FIG. 5. Computed signature may be computed signature 524 from FIG. 5. In this advantageous embodiment, measured signature 806 was measured using step time domain reflectometry and computed signature 808 was generated using a computed simulation of step time domain reflectometry. Thus, measured signature 806 and computed signature 808 are presented as step graphs. On a step time domain reflectometry graph, a horizontal line segment is presented between data points. When the point of the next data point on the horizontal axis is reached, a vertical line segment is presented from the end of the horizontal line segment to the data point.

For example, assume a first data point is at time 0 with a value of 5 and a second data point is at time 2 with a value of 8. A step graph would be presented by presenting a horizontal line beginning from the first data point. The horizontal line would extend from time 0 to time 2. At time 2, a vertical line segment would be presented beginning at the end of the horizontal line segment at time 2 and the data point at the value of 8. Of course, in some advantageous embodiments, graph 800 presents additional segments and/or data.

Turning now to FIG. 9, an illustration of a difference graph is depicted in accordance with an advantageous embodiment. Graph 900 is a graph that presents the difference between measured signature 806 and computed signature 808. In this advantageous embodiment, graph 900 presents a graphical representation of the value of measured signature 806—the value of computed signature 808. The difference may be an example implementation of difference 560 in FIG. 5. For each point on distance axis 802, graph 900 may present the value of measured signature 806 for the corresponding point on distance axis 802 subtracted from the value of computed signature 808 for the corresponding point on distance axis 802.

In this example, measured signature 806 and computed signature 808 are not identical. Difference areas 904 may be areas 548 from FIG. 5. Difference areas 904 represent points in the tested portion of the wiring system that did not return the strength of reflected signal that was simulated for computed signature 808.

One or more of difference areas 904 may be present because there is an inconsistency in the tested portion of the wiring system at the distance or distances from the location from which the test signals were sent. However, in other examples, difference areas 904 may be present because of a margin of error in the simulation. The margin of error may be present if effect of neighboring environment 530 from FIG. 5, influence the test signals in the tested portion of the wiring system.

In one example, a portion of difference areas 904 may be presented on graph 900 if a difference area is present on graph 800 due to one or more wires being physically moved closer to or further from another wire run and/or another connector and/or a portion of a metallic frame. In one example, wires in the tested portion of an airplane wiring system moved closer to a metallic body panel during flight due to the movement of the airplane.

The margin of error may also be present if wire length in the tested portion of the wiring system differs from the wire length used to generate computed signature 808. The wire length may be different from the wire length used to generate computed signature 808 because a modification was made to the wiring system during manufacture or maintenance.

On graph 900, reflected signal axis 908 is an axis representing the strength of the reflected test signals at the point from which the test signals were transmitted, as in reflected signal axis 804. On reflected signal axis 908, however, point 906 indicates that the strength of the reflected test signals is zero for a particular point on distance axis 802.

In some advantageous embodiments, difference areas 904 are identified using an identifier, such as identifier 902. Identifier 902 may be presented to call attention to difference areas 904. However, in some illustrative embodiments, identifier 902 is only presented when difference areas 904 meet one or more conditions.

For example, identifier 902 may be presented when difference areas 904 exceed a specified threshold, such as specified threshold 552 in FIG. 5. When a difference area 904 exceeds a specified threshold, it is likely that one or more inconsistencies in the tested portion of the wiring system are located at the distance from the point at which the test signals were sent that corresponds to the value on distance axis 802 for the identified difference area 810. In another advantageous embodiment, identifier 902 is presented at the most significant event on graph 900. The most significant event on graph 800 may be the greatest difference area 904. In other words, identifier 902 may be presented at the point on distance axis 802 where measured signature 806 differs from computed signature 808 more than any other point on distance axis 802 on graph 800. In this example, identifier 902 is presented at the point on distance axis 802 where the value of measured signature 806—the value of computed signature 808 is greater than the value of measured signature 806—the value of computed signature 808 at any other point on graph 800.

Figure 10:
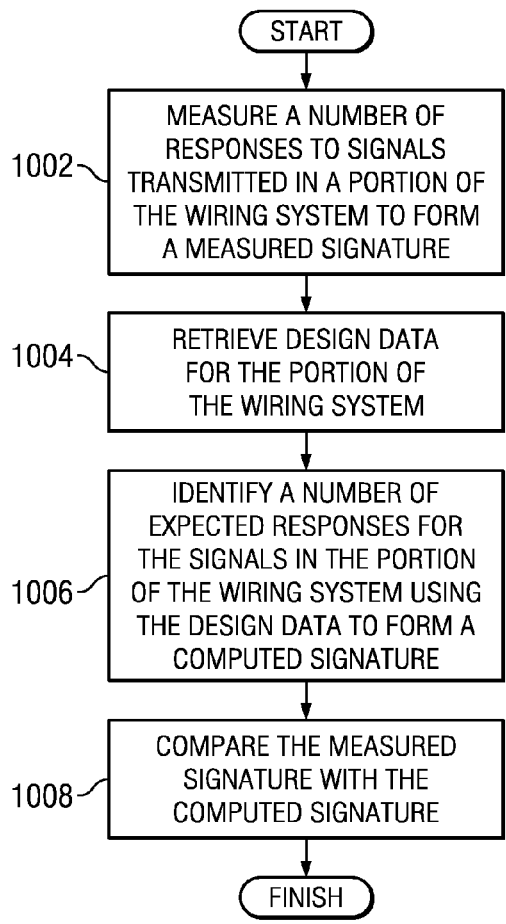
FIG. 10 depicts a flowchart of a process for monitoring a wiring system in accordance with an advantageous embodiment.

Turning now to FIG. 10, a flowchart of a process for monitoring a wiring system is depicted in accordance with an advantageous embodiment. The process may be performed by test unit 562 from FIG. 5, simulation unit 578 from FIG. 5, or data processing system 400 from FIG. 4, either alone or in combination. The process may be implemented in a wire monitoring environment, such as wire monitoring environment 500 from FIG. 5.

The process begins by measuring a number of responses to signals transmitted in a portion of the wiring system to form a measured signature (operation 1002). The process then retrieves design data for the portion of the wiring system (operation 1004). The process then identifies a number of expected responses for the signals in the portion of the wiring system using the design data to form a computed signature (operation 1006). The process then compares the measured signature with the computed signature (operation 1008). The process terminates thereafter.

These different operations in FIG. 10 are presented for purposes of illustrating one manner in which a wiring system may be monitored. In other advantageous embodiments, other operations may be used in place of or in addition to the ones illustrated here. Further, some operations may be omitted depending on the particular type of display. For example, in one advantageous embodiment, the computed signature and the measured signature are transmitted to a service provider between operation 1006 and operation 1008.

Figure 11:
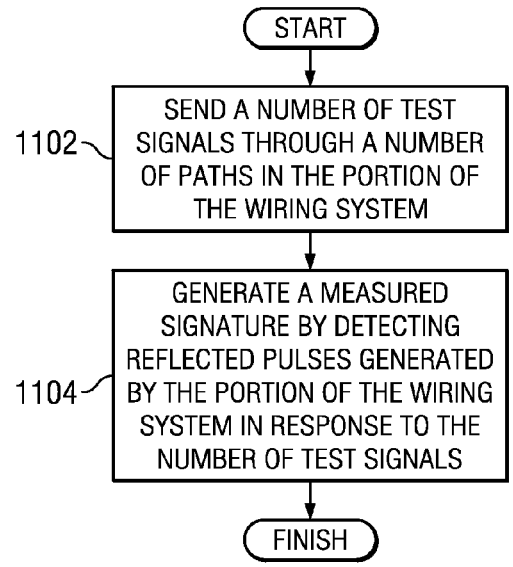
FIG. 11 depicts a flowchart of a process for measuring a number of responses to signals transmitted in a portion of the wiring system to form a measured signature in accordance with an advantageous embodiment.

Turning now to FIG. 11, a flowchart of a process for measuring a number of responses to signals transmitted in a portion of the wiring system to form a measured signature is depicted in accordance with an advantageous embodiment. The process may be performed by test unit 562 from FIG. 5, simulation unit 578 from FIG. 5, or data processing system 400 from FIG. 4, either alone or in combination. The process may be implemented in a wire monitoring environment, such as wire monitoring environment 500 from FIG. 5. The process may further implement operation 1002 from FIG. 10.

The process begins by sending a number of test signals through a number of paths in the portion of the wiring system (operation 1102). The process continues by generating a measured signature by detecting reflected pulses generated by the portion of the wiring system in response to the number of test signals (operation 1104). The process terminates thereafter.

Figure 12:
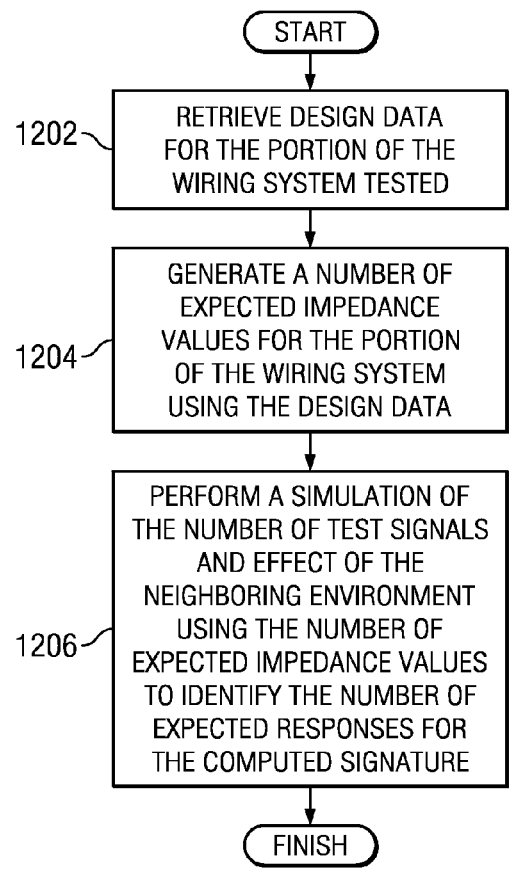
FIG. 12 depicts a flowchart of a process for retrieving design data for the portion of the wiring system and identifying a number of expected responses for the signals in the portion of the wiring system using the design data to form a computed signature in accordance with an advantageous embodiment.

Turning now to FIG. 12, a flowchart of a process for retrieving design data for the portion of the wiring system and identifying a number of expected responses for the signals in the portion of the wiring system using the design data to form a computed signature is depicted in accordance with an advantageous embodiment. The process may be performed by test unit 562 from FIG. 5, simulation unit 578 from FIG. 5, or data processing system 400 from FIG. 4, either alone or in combination. The process may be implemented in a wire monitoring environment, such as wire monitoring environment 500 from FIG. 5. The process may further implement operations 1004 and 1006 from FIG. 10.

The process begins by retrieving design data for the portion of the wiring system tested (operation 1202). Operation 1202 may be an implementation of operation 1004 from FIG. 10. The process then generates a number of expected impedance values for the portion of the wiring system using the design data (operation 1204). The process then performs a simulation of the number of test signals and an effect of the neighboring environment using the number of expected impedance values to identify the number of expected responses for the computed signature (operation 1206).

In one advantageous embodiment, the simulation is performed using a mathematical model. In some advantageous embodiments, the process reduces the error in the number of expected impedance values using known properties of the test unit and/or the portion of the wiring system. In other words, the process may modify the magnitude and distance relationship of expected impedance values for particular distances based on characteristics of the test unit and/or the portion.

For example, the process may modify values in number of expected impedance values 596 when a particular type of test unit 562 transmitted measured signature 510. In other words, simulation unit 578 may increase or decrease number of expected impedance values when test unit 562 is known to simulation unit 578 to be calibrated more sensitive or less sensitive than a normal test unit.

Effect of neighboring environment 530 in FIG. 5 may comprise any combination of number of adjacent wire runs to the portion of the wiring system and a number of adjacent connector pins to the portion of the wiring system. Operation 1204 and operation 1206 may implement operation 1006 from FIG. 10. The process terminates thereafter.

Figure 13:
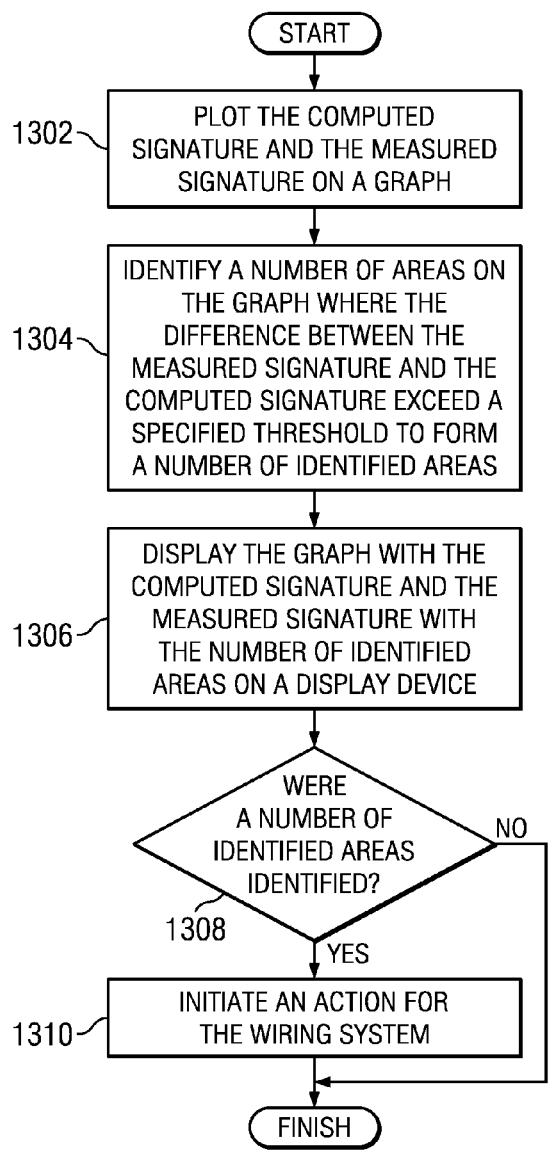
FIG. 13 depicts a flowchart of a process for comparing the measured signature with the computed signature in accordance with an advantageous embodiment.

Turning now to FIG. 13, a flowchart of a process for comparing the measured signature with the computed signature is depicted in accordance with an advantageous embodiment. The process may be performed by test unit 562 from FIG. 5, simulation unit 578 from FIG. 5, or data processing system 400 from FIG. 4, either alone or in combination. The process may be implemented in a wire monitoring environment, such as wire monitoring environment 500 from FIG. 5. The process may further implement operation 1008 from FIG. 10.

The process begins by plotting the computed signature and the measured signature on a graph (operation 1302). The process then identifies a number of areas on the graph where the difference between the measured signature and the computed signature exceed a specified threshold to form a number of identified areas (operation 1304). In one advantageous embodiment, the graph is a graph, such as graph 800 from FIG. 8.

The process then displays the graph with the computed signature and the measured signature with the number of identified areas on a display device (operation 1306). The display device may be a display, such as display 214 in FIG. 2.

The process then determines whether a number of identified areas were identified in operation 1304 (operation 1308). The process determines that a number of identified areas were identified in operation 1304 if one or more of the differences on the graph exceeded the specified threshold. The specified threshold may be specified by a user or generated based on known properties of the portion of the wiring system and/or the test unit. For example, the threshold may be lower when the measured signature is generated by a test unit that is more accurate. Additionally, the specified threshold may be higher for a particular location on the graph when the portion of the wiring system being tested comprises different types of wires than is contained in the design data for the portion. If no areas contained a difference that exceeded the specified threshold, the process determines that a number of identified areas were not identified in operation 1304.

If the process determines that a number of identified areas were identified in operation 1304, the process initiates an action for the wiring system (operation 1310). The action may be presenting an alert requesting an inspection of the identified area in the wiring system, presenting an indicator on the graph, sending the measured signature to a wiring system maintainer, and/or storing the measured signature in a diagnostic log associated with the wiring system. The process terminates thereafter. If the process determines that a number of identified areas were not identified in operation 1304, the process terminates.

Figure 14:
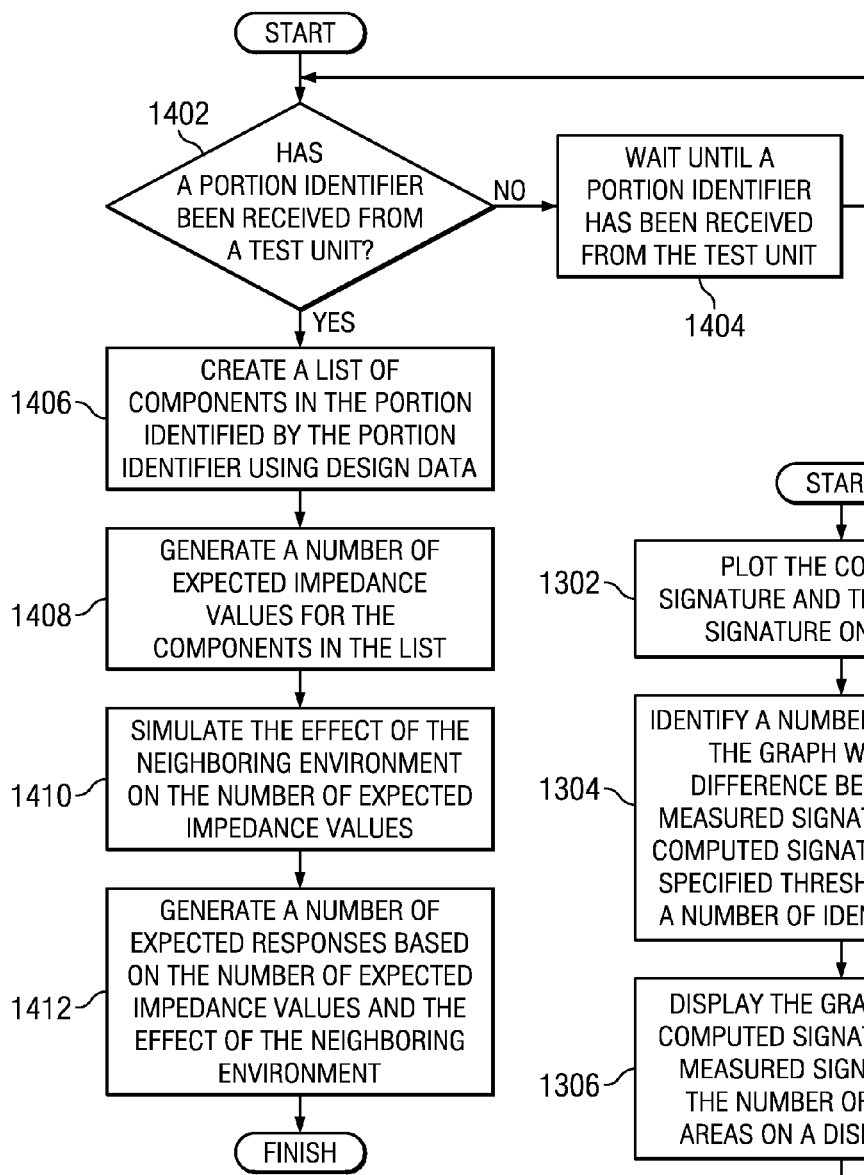
FIG. 14 depicts a flowchart of a process for identifying a number of expected responses for the signals in the portion of the wiring system using the design data to form a computed signature in accordance with an advantageous embodiment.

Turning now to FIG. 14, a flowchart of a process for identifying a number of expected responses for the signals in the portion of the wiring system using the design data to form a computed signature is depicted in accordance with an advantageous embodiment. The process may be performed in wire monitoring environment 500 by simulation unit 578. The process may be another example implementation of operation 1006 in FIG. 10.

The process begins by determining whether a portion identifier has been received from a test unit (operation 1402). The portion identifier is an example implementation of portion identifier 574 in FIG. 5. If a portion identifier has not been received from the test unit, the process waits for a portion identifier to be received from the test unit (operation 1404). When a portion identifier is received, the process returns to operation 1402.

If a portion identifier has been received from a test unit, the process creates a list of components in the portion identified by the portion identifier using design data (operation 1406). The list may comprise an identifier, a description, and other suitable information about the components. The list may be an example implementation of list 592.

The process then generates a number of expected impedance values for the components in the list (operation 1408). The number of expected impedance values may be an example implementation of expected number of impedance values 596. The number of expected impedance values may be generated by using a model, such as model 528. In one advantageous embodiment, the model is mathematical model. In some advantageous embodiments, the process uses the model generates a number of expected responses by calculating reflection coefficients and representing the reflection coefficients as a series of impulse responses. The process may then use the model to integrate the impulse responses to simulate a step time domain reflectometry signature.

The process then simulates the effect of the neighboring environment on the number of expected impedance values (operation 1410). The effect of the neighboring environment 530 may include, for example, changes to test signals due to the presence of a number of adjacent wires to the portion of the wiring system being tested, a number of adjacent connector pins to the portion, and number of adjacent grounding or electrical paths to the portion. In an advantageous embodiment, the neighboring environment causes electromagnetic interference in the portion when test signals are transmitted through the portion.

The process then generates a number of expected responses based on the number of expected impedance values and the effect of the neighboring environment (operation 1412). The number of expected responses is the number of expected impedance values, as modified by the effect of the neighboring environment 530. The process terminates thereafter.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

For example, operations 1402 and 1404 in FIG. 14 may not be performed in advantageous embodiments in which the test unit and the simulation unit are a single unit. Additionally, at operation 1410, the effect of the neighboring environment may be identified by locating the elements of the neighboring environment in a table containing the change to test signals due to the element being located a particular distance from the portion of the wiring system being tested. In another advantageous embodiment, operations 1308 and 1310 are not performed. In such advantageous embodiments, the process terminates after operation 1306.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer-usable or computer-readable medium providing program code for use by or in connection with a computer or any device or system that executes instructions. For the purposes of this disclosure, a computer-usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include compact disk—read only memory (CD-ROM), compact disk—read/write (CD-R/W) and DVD.

Further, a computer-usable or computer-readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation to keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters are just a few of the currently available types of communications adapters.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for monitoring a wiring system using a computer processor, the method comprising:
   measuring a number of responses to signals transmitted in a portion of the wiring system to form a measured signature;
   retrieving design data for the portion of the wiring system;
   identifying a number of expected responses for the signals in the portion of the wiring system using the design data to form a computed signature; and
   comparing using the computer processor the measured signature with the computed signature, including plotting the computed signature and the measured signature on a graph;—identifying a number of areas on the graph where a difference between the computed signature and the measured signature exceeds a specified threshold to form a number of identified areas; and displaying the graph with the computed signature, the measured signature, and the number of identified areas on a display device.

2. The method of claim 1 further comprising:
   responsive to identifying the number of areas on the graph where the difference exceeds the specified threshold, initiating an action for the wiring system.

3. The method of claim 2, wherein the action is selected from presenting an alert requesting an inspection of an identified area in the number of identified areas, sending the measured signature to a wiring system maintainer, and storing the measured signature and the difference in a diagnostic log associated with the wiring system.

4. The method of claim 1, wherein the step of measuring the number of responses to signals transmitted in the portion of the wiring system to form the measured signature is performed using time domain reflectometry, sequence time domain reflectometry, standing wave reflectometry, or spread-spectrum time domain reflectometry.

5. A computer program product comprising:
a non-transitory computer readable storage medium;
a first program code, stored on the computer readable storage medium, for measuring a number of responses to signals transmitted in a portion of the wiring system to form a measured signature;
a second program code, stored on the computer readable storage medium, for retrieving design data for the portion of the wiring system;
a third program code, stored on the computer readable storage medium, for identifying a number of expected responses for the signals in the portion of the wiring system using the design data to form a computed signature; and
a fourth program code, stored on the computer readable storage medium, for comparing the measured signature with the computed signature, wherein the fourth program code further comprises:
a fifth program code, stored on the computer readable storage medium, for plotting the computed signature and the measured signature on a graph;
a sixth program code, stored on the computer readable storage medium, for identifying a number of areas on the graph where a difference between the computed signature and the measured signature exceeds a specified threshold to form a number of identified areas; and
a seventh program code, stored on the computer readable storage medium, for displaying the graph with the computed signature, the measured signature, and the number of identified areas on a display device.

6. The computer program product of claim 5 further comprising:
responsive to identifying the number of areas on the graph where the difference exceeds the specified threshold, initiating an action for the wiring system.

7. The computer program product of claim 6, wherein the action is selected from presenting an alert requesting an inspection of an identified area in the number of identified areas, sending the measured signature to a wiring system maintainer, and storing the measured signature and the difference in a diagnostic log associated with the wiring system.

8. The computer program product of claim 6, wherein the first program code, stored on the computer readable storage medium, for measuring the number of responses to signals transmitted in the portion of the wiring system to form the measured signature further comprises an eighth program code for using time domain reflectometry, sequence time domain reflectometry, standing wave reflectometry, or spread-spectrum time domain reflectometry.

9. An apparatus comprising:
a bus;
a memory connected to the bus; and
a processor unit connected to the bus, wherein the processor unit is configured to;
measure a number of responses to signals transmitted in a portion of the wiring system to form a measured signature,
retrieve design data for the portion of the wiring system,
identify a number of expected responses for the signals in the portion of the wiring system using the design data to form a computed signature,
compare the measured signature with the computed signature;
plot the computed signature and the measured signature on a graph;
identify a number of areas on the graph where a difference between the measured signature and the computed signature exceeds a specified threshold to form a number of identified areas; and
display the graph with the computed signature, the measured signature, and the number of identified areas on a display device.

10. The apparatus of claim 9, wherein the processor unit is further configured to:
initiate an action for the wiring system responsive to identifying the number of areas on the graph where the difference exceeds the specified threshold.

11. The apparatus of claim 10, wherein the action is selected from presenting an alert requesting an inspection of an identified area in the number of identified areas, sending the measured signature to a wiring system maintainer, and storing the measured signature and the difference in a diagnostic log associated with the wiring system.

12. The apparatus of claim 9, wherein the number of test signals is a number of spread spectrum test signals, and wherein the processor unit being configured to send a number of test signals through a number of paths in the portion of the wiring system further comprises:
the processor unit being configured to send the number of spread spectrum test signals through the number of paths in the portion of the wiring system, wherein the number of spread spectrum test signals is modulated with a pseudo noise code.

* * * * *